(12) United States Patent
Wincheski et al.

(10) Patent No.: US 8,717,012 B2
(45) Date of Patent: May 6, 2014

(54) EDDY CURRENT PROBE FOR SURFACE AND SUB-SURFACE INSPECTION

(75) Inventors: Russell A. Wincheski, Williamsburg, VA (US); John W. Simpson, Yorktown, VA (US)

(73) Assignee: The United States of America as respresented by the United States National Aeronautics and Space Administration, Washington, DC (US)

( * ) Notice: Subject to any disclaimer, the term of this patent is extended or adjusted under 35 U.S.C. 154(b) by 264 days.

(21) Appl. No.: 13/457,687

(22) Filed: Apr. 27, 2012

(65) Prior Publication Data

US 2012/0274319 A1 Nov. 1, 2012

Related U.S. Application Data

(60) Provisional application No. 61/479,918, filed on Apr. 28, 2011.

(51) Int. Cl.
*G01N 27/72* (2006.01)
*G01N 27/82* (2006.01)
*G01R 33/14* (2006.01)
*G01R 33/00* (2006.01)
*G01B 7/16* (2006.01)

(52) U.S. Cl.
USPC ........... 324/239; 324/240; 324/222; 324/225; 73/763

(58) Field of Classification Search
CPC ................................ G01N 27/90; G01R 33/12
USPC .............................. 324/220, 239, 240; 73/762
See application file for complete search history.

(56) References Cited

U.S. PATENT DOCUMENTS

| | | | | |
|---|---|---|---|---|
| 3,881,151 A * | 4/1975 | Bigelow, Jr. | | 324/226 |
| 5,028,869 A * | 7/1991 | Dobmann et al. | | 324/223 |
| 5,365,170 A * | 11/1994 | Beckley | | 324/239 |
| 5,493,511 A | 2/1996 | Wincheski et al. | | |
| 5,617,024 A | 4/1997 | Simpson et al. | | |
| 5,648,721 A | 7/1997 | Wincheski et al. | | |
| 5,698,977 A | 12/1997 | Simpson et al. | | |
| 5,942,894 A * | 8/1999 | Wincheski et al. | | 324/220 |
| 6,157,190 A * | 12/2000 | Nagaishi et al. | | 324/242 |
| 6,583,617 B2 * | 6/2003 | LeVert et al. | | 324/235 |
| 6,888,346 B2 * | 5/2005 | Wincheski et al. | | 324/235 |
| 7,278,324 B2 | 10/2007 | Smits et al. | | |

(Continued)

OTHER PUBLICATIONS

Stic Search Report.*

*Primary Examiner* — Patrick Assouad
*Assistant Examiner* — Christopher McAndrew
(74) *Attorney, Agent, or Firm* — Andrea Z. Warmbier

(57) ABSTRACT

An eddy current probe includes an excitation coil for coupling to a low-frequency alternating current (AC) source. A magnetoresistive sensor is centrally disposed within and at one end of the excitation coil to thereby define a sensing end of the probe. A tubular flux-focusing lens is disposed between the excitation coil and the magnetoresistive sensor. An excitation wire is spaced apart from the magnetoresistive sensor in a plane that is perpendicular to the sensor's axis of sensitivity and such that, when the sensing end of the eddy current probe is positioned adjacent to the surface of a structure, the excitation wire is disposed between the magnetoresistive sensor and the surface of the structure. The excitation wire is coupled to a high-frequency AC source. The excitation coil and flux-focusing lens can be omitted when only surface inspection is required.

20 Claims, 3 Drawing Sheets

(56) References Cited

U.S. PATENT DOCUMENTS

| | | | |
|---|---|---|---|
| 7,759,931 B2* | 7/2010 | Tsukada et al. | 324/235 |
| 8,164,328 B2 | 4/2012 | Wincheski et al. | |
| 8,180,585 B2* | 5/2012 | Cech et al. | 702/65 |
| 2001/0015643 A1* | 8/2001 | Goldfine et al. | 324/242 |
| 2003/0132748 A1* | 7/2003 | Hiroshima | 324/240 |
| 2005/0007108 A1* | 1/2005 | Dogaru | 324/235 |
| 2005/0104585 A1* | 5/2005 | Bilik et al. | 324/240 |
| 2005/0225322 A1* | 10/2005 | Muller et al. | 324/239 |
| 2006/0132123 A1* | 6/2006 | Wang et al. | 324/239 |
| 2008/0042645 A1* | 2/2008 | Kaack et al. | 324/220 |
| 2008/0315870 A1* | 12/2008 | May | 324/239 |
| 2009/0140742 A1* | 6/2009 | Koch et al. | 324/426 |
| 2009/0242200 A1* | 10/2009 | Badoux et al. | 166/255.2 |
| 2009/0243594 A1* | 10/2009 | Kahlman | 324/202 |
| 2010/0052665 A1* | 3/2010 | Van Den Homberg et al. | 324/228 |
| 2010/0109653 A1* | 5/2010 | Nieuwenhuis et al. | 324/204 |
| 2012/0019239 A1* | 1/2012 | Decitre | 324/239 |
| 2012/0129277 A1* | 5/2012 | Lahiri et al. | 438/10 |

\* cited by examiner

EDDY CURRENT PROBE FOR SURFACE AND SUB-SURFACE INSPECTION

CROSS-REFERENCE TO RELATED PATENT APPLICATIONS

This patent application claims the benefit of and priority to U.S. Provisional Patent Application No. 61/479,918, filed on Apr. 28, 2011, the contents of which are hereby incorporated by reference in their entirety.

STATEMENT REGARDING FEDERALLY SPONSORED RESEARCH OR DEVELOPMENT

The invention was made in part by an employee of the United States Government and may be manufactured and used by or for the Government of the United States of America for governmental purposes without the payment of any royalties thereon or therefor.

FIELD OF THE INVENTION

This invention relates to eddy current probes. More specifically, the invention is an eddy current probe for inspecting a structure's surface and sub-surface regions.

BACKGROUND OF THE INVENTION

Non-destructive evaluation (NDE) technologies are used to inspect a variety of structures for fatigue and corrosion damage. One type of NDE technology is an eddy current probe that includes the use of a magnetoresistive sensor. Designs of conventional eddy current probes are optimized for detection of surface and sub-surface structural problems that are typically up to 10 millimeters from a structure's surface. However, these conventional eddy current probes are not particularly effective at high-resolution detection/characterization of anomalies at a structure's surface.

SUMMARY OF THE INVENTION

Accordingly, it is an object of the present invention to provide an eddy current probe.

Another object of the present invention is to provide an eddy current probe that can be used to detect both surface and sub-surface anomalies.

In accordance with the present invention, an eddy current probe for surface and sub-surface inspection includes an excitation coil having windings that are coupled to a low-frequency alternating current (AC) source. A magnetoresistive sensor is centrally disposed within the excitation coil and at one end of the excitation coil to thereby define a sensing end of the eddy current probe. In use, the sensing end of the eddy current probe is positioned adjacent to a surface of a structure. The magnetoresistive sensor has an axis of sensitivity. A tubular flux-focusing lens is disposed between the excitation coil and the magnetoresistive sensor to prevent magnetic coupling between the excitation coil and the magnetoresistive sensor. The lens is made from an electrically conductive material having a high magnetic permeability. An excitation wire is spaced apart from the magnetoresistive sensor in a plane that is perpendicular to the sensor's axis of sensitivity and such that, when the sensing end of the eddy current probe is positioned adjacent to the surface of the structure, the excitation wire is disposed between the magnetoresistive sensor and the surface of the structure. The excitation wire is coupled to a high-frequency AC source. For inspections limited to surfaces, the excitation coil and flux-focusing lens can be omitted.

DETAILED DESCRIPTION OF THE INVENTION

Figure 1:
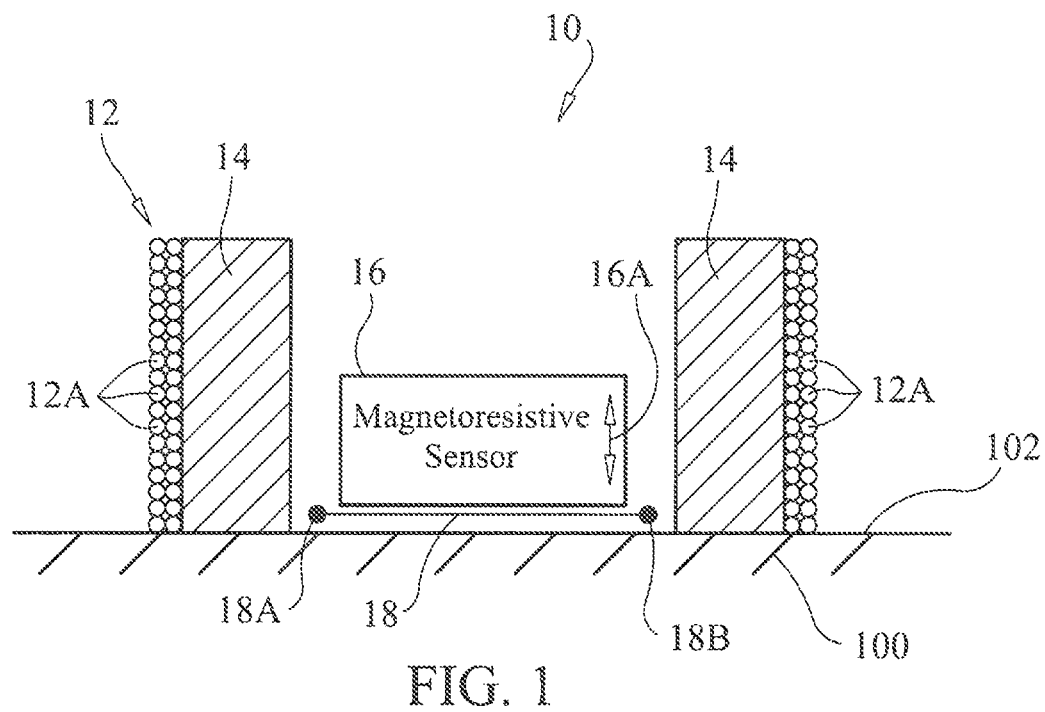
FIG. 1 is a cross-sectional schematic view of an eddy current probe for surface and sub-surface inspection in accordance with an embodiment of the present invention.

Referring now to the drawings and more particularly to FIG. 1, an eddy current probe in accordance with an embodiment of the present invention is shown and is referenced generally by numeral 10. As will be explained further herein, eddy current probe 10 is capable of detecting anomalies under a surface 102 of a structure 100 as well as on surface 102. Structure 100 could be, but is not limited to, a laminated structure such as those used in fabricating aircraft structures.

Probe 10 illustrates only those elements that form the measurement "head" of an eddy current probe system that will be described later herein. Further, probe 10 only illustrates the elements involved with making measurements as probe 10 will generally include various mechanical features (not shown) to support the measurement elements as would be understood by one of ordinary skill in the art.

For deep flaw detection, probe 10 can include features of the magneto resistive flux-focusing eddy current probe described in U.S. Pat. No. 6,888,346, the content of which is hereby incorporated by reference. More specifically, probe 10 includes an excitation or drive coil 12 defined by a number of windings 12A that form an open-ended cylinder. Disposed within excitation coil 12 is a flux focusing lens 14 defined by an open-ended tube of electrically conductive material having a high magnetic permeability that is generally $100 \times 4\pi \times 10^{-7}$ Henry per meter (H/m) (or 100 $\mu_0$H/m) or greater. Disposed within flux focusing lens 14 and at one end thereof is a magnetoresistive sensor 16 such as an anisotropic magnetoresistive (AMR) sensor or a giant magnetoresistive (GMR) sensor, both of which are integrated circuit packages.

Magnetoresistive sensor 16 is positioned within and at one end of flux focusing lens 14 such that an axis of sensitivity 16A of sensor 16 is oriented as needed for a particular measurement application. For example, in the illustrated embodiment, axis of sensitivity 16A is perpendicular to surface 102 when probe 10 is positioned thereover as illustrated. However, the present invention does not require sensor 16 to be positioned such its axis of sensitivity was parallel to surface 102 when probe 10 is positioned thereover. As would be understood by one of ordinary skill in the art, a magnetoresistive sensor's axis sensitivity is a linear axis in three-dimensional Euclidean space along which the sensor's maximum response is achieved with respect to changes in magnetic fields described in U.S. Pat. No. 6,888,346. The above-described elements can be used to detect flaws under surface 102 when excitation coil 12 is driven by an alternating current (AC) source (not shown) of relatively low frequency. Depending on the particular application, low frequency can be at or near DC up to as much as 100 KHz.

Probe 10 is further configured to simultaneously be sensitive to anomalies (e.g., holes, scratches, cracks, nicks, etc.) at surface 102 of structure 100. To do this, probe 10 includes an excitation wire 18 (e.g., a single-strand, electrically-conductive wire) arranged to lie in a plane that is spaced apart from magnetoresistive sensor 16 with wire 18 being perpendicular to axis of sensitivity 16A of magnetoresistive sensor 16. The perpendicularlity of excitation wire 18 relative to axis of sensitivity 16A can also be maintained when sensor 16 is positioned such that its axis of sensitivity 16A will be parallel to surface 102 when probe 10 is positioned thereover.

Between its end nodes 18A and 18B, excitation wire 18 spans the sensing element(s) (e.g., typically a Wheatstone bridge) of magnetoresistive sensor 16. To detect anomalies at surface 102, excitation wire 18 is driven by an AC source (not shown) of relatively high frequency. In this way, excitation wire 18 serves as a second (high frequency) induction source with excitation coil 12 serving as a first (low frequency) induction source. As used herein with respect to excitation wire 18, high frequency refers to a frequency that is greater than that used to drive excitation coil 12 and, depending on the application, generally ranges from greater than 100 KHz to several megahertz. The depth that an electromagnetic field penetrates into a structure is a function of the structure's conductivity and the electromagnetic field's frequency as governed by Maxwell's equations.

Figure 2:
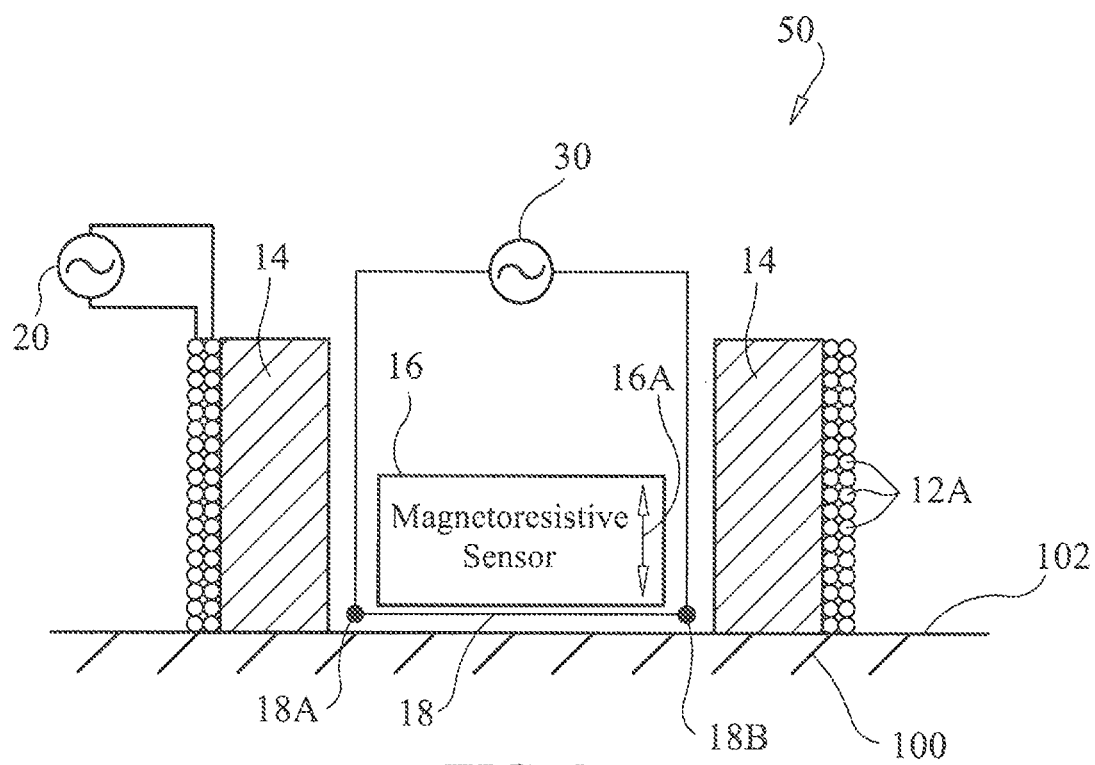
FIG. 2 is a cross-sectional schematic view of an eddy current probe coupled to two alternating current (AC) sources to form an eddy current probe system for surface and sub-surface inspection in accordance with another embodiment of the present invention.

As mentioned above, probe 10 can be incorporated into an eddy current probe system by coupling appropriate drive sources thereto. Accordingly, FIG. 2 illustrates such an eddy current probe system 50 where a low-frequency AC source 20 is coupled to excitation coil 12 and a high-frequency AC source 30 is coupled to excitation wire 18. The particular frequencies for sources 20 and 30 are determined for a particular application. If not included with magnetoresistive sensor 16, measurement electronics 40 can be provided and coupled to sensor 16. Measurement electronics 40 is assumed to include, if necessary, background signal removal and/or biasing elements as are typically required if sensor 16 is GMR sensor.

Figure 3:
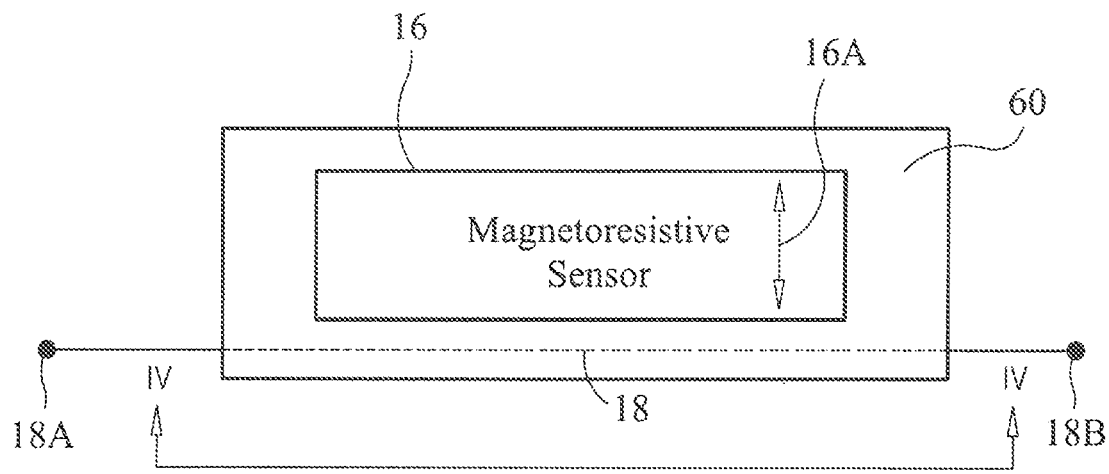
FIG. 3 is an isolated schematic view of a magnetoresistive sensor encased in a dielectric housing that has a channel formed therein to receive an excitation wire in accordance with an embodiment of the present invention.

Magnetoresistive sensor 16 is generally provided within an integrated circuit (IC) chip package. In this embodiment, the present invention can make use of the IC chip package's dielectric housing. This is illustrated schematically in FIG. 3 where magnetoresistive sensor 16 is encased within an IC chip's dielectric housing 60. For clarity of illustration, other electronics that could be included with sensor 16 have been omitted. Further, electrically conductive pins that are used as leads between sensor 16 and any other external measurement electronics are also not shown. To position excitation wire 18 in a plane that is perpendicular to axis of sensitivity 16A, wire 18 can be passed through dielectric housing 60. In this way, excitation wire 18 can be positioned close to magnetoresistive sensor 16 and is protected from damage when the eddy current probe incorporating same is moved over a surface to be measured.

Figure 4:
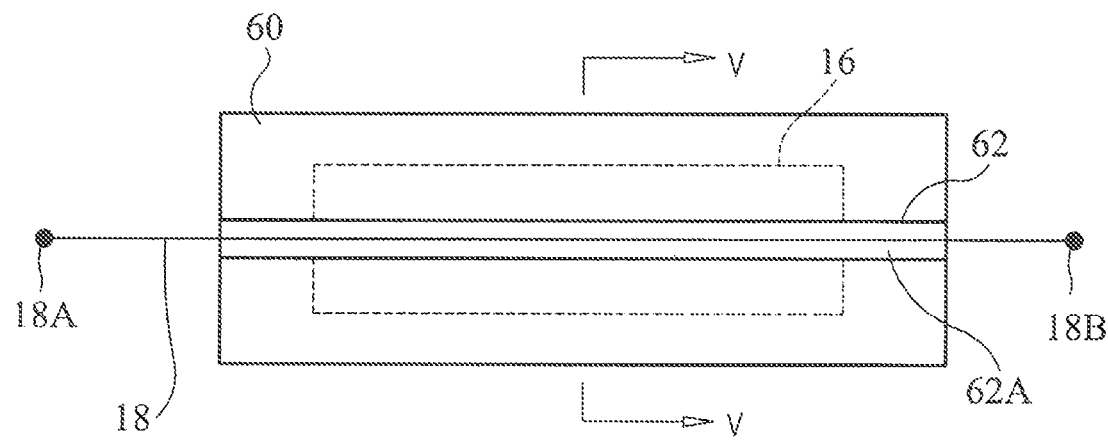
FIG. 4 is a plan view of the magnetoresistive sensor's dielectric housing taken along line IV of FIG. 3 illustrating a one-dimensional channel formed therein with the excitation wire residing in the channel in accordance with an embodiment of the present invention.
Figure 5:
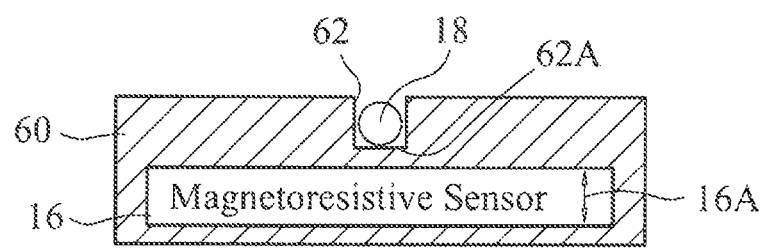
FIG. 5 is a cross-sectional view of the magnetoresistive sensor's dielectric housing taken along line V in FIG. 4.

Positioning of excitation wire 18 can be achieved during the incorporation of magnetoresistive sensor 16 into dielectric housing 60. However, the present invention is not so limited as excitation wire 18 could also be retrofitted into an existing magnetoresistive sensor. For example, FIGS. 4 and 5 illustrate an embodiment of the present invention where dielectric housing 60 has a channel 62 formed therein with a base 62A of channel 62 lying in a plane perpendicular to axis of sensitivity 16A. The width of channel 62 and diameter of wire 18 are not shown to scale in order to more clearly illustrate the present invention. Channel 62 could be formed in housing 60 as a post-fabrication process.

Figure 6:
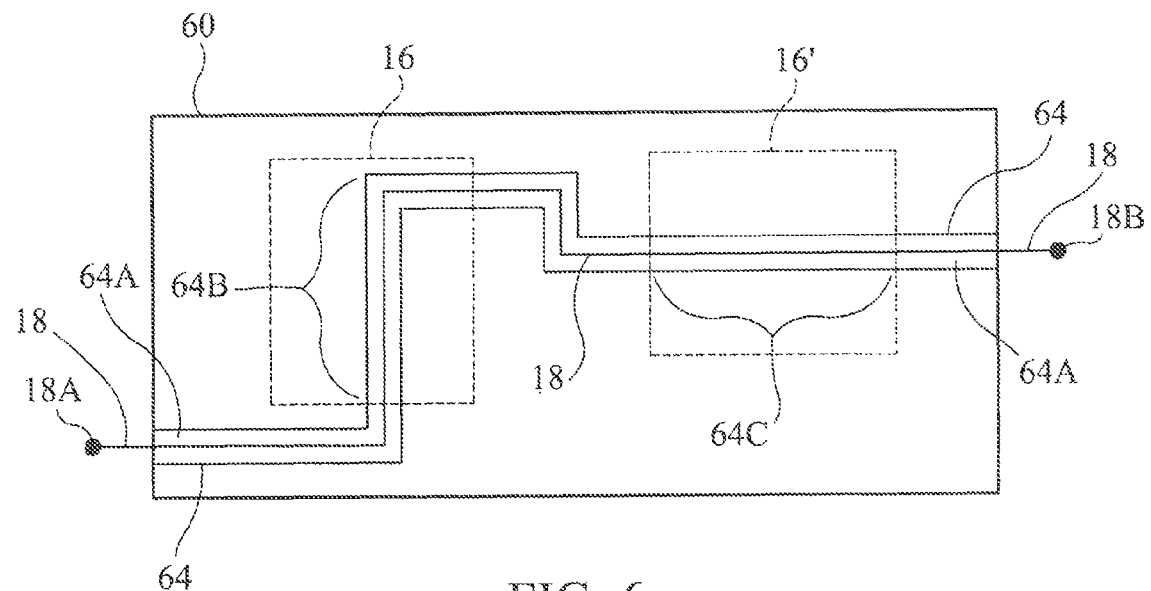
FIG. 6 is a plan view of the magnetoresistive sensor's dielectric housing illustrating a channel formed therein that defines two orthogonal dimensions with the excitation wire residing in the channel in accordance with another embodiment of the present invention.

Experimental testing of the above-described probes has shown that sensed/imaged surface features are elongated in a direction aligned with the length of excitation wire 18. In addition, very thin anomalies aligned with excitation wire 18 could be missed. This effect can be eliminated by the embodiment illustrated in FIG. 6 where measurement resolution and sensitivity of the eddy sensor probe are improved by providing two magnetoresistive sensors and positioning the probe's excitation wire in at least two dimensions of its mounting plane. More specifically, FIG. 6 illustrates such an embodiment where dielectric housing 60 encases two magnetosensitive sensors 16 and 16'. A shaped channel 64 and corresponding base 64A is formed in housing 60 and traverses sensors 16 and 16' with legs 64B and 64C being orthogonal to one another. As in the previous example, base 64A of leg 64B orients one portion of excitation wire 18 perpendicular to the axis of sensitivity associated with sensor 16 while base 64A of leg 64C orients another portion of excitation wire 18 perpendicular to the axis of sensitivity associated with sensor 16'. In this way, when excitation wire 18 is led through channel 64 along base 64A, excitation wire 18 essentially defines a dual induction source as the portion of wire 18 in leg 64B forms a first induction source and the portion of wire 18 in leg 64C forms a second induction source.

The advantages of the present invention are numerous. The probe configuration includes two induction sources with a single pickup sensor. The use of a magnetoresistive device as the magnetic field sensor enables efficient monitoring of magnetic fields at frequencies from DC to megahertz. The present invention adds capabilities for high frequency, high spatial resolution of surface features and surface breaking defects. Tests of the present invention show a significant increase in the resolvability of small and closely spaced surface anomalies as compared to a conventional eddy current "pencil" probe. Thus, the present invention provides a wide bandwidth probe with dual induction sources for simultaneous low-frequency deep flaw detection and high frequency high-resolution near-surface material characterization.

Figure 7:
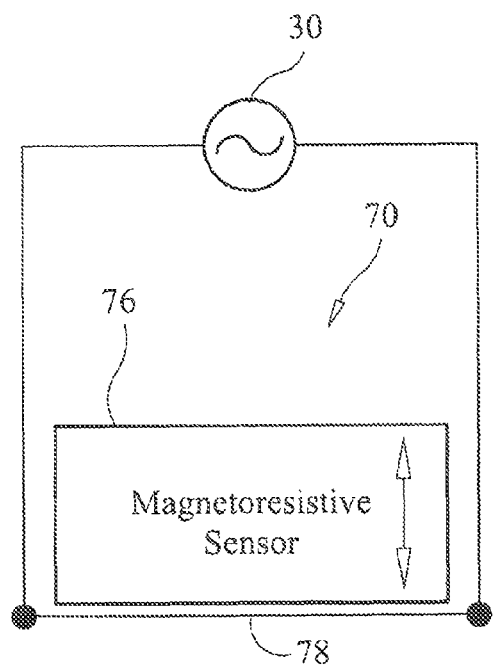
FIG. 7 is a cross-sectional schematic view of an eddy current probe for surface inspection in accordance with another embodiment of the present invention.

Although the invention has been described relative to a specific embodiment thereof, there are numerous variations and modifications that will be readily apparent to those skilled in the art in light of the above teachings. For example, a simple surface-inspection eddy current probe could also be constructed in accordance with the present invention as illustrated in FIG. 7. More specifically, the measurement head of an eddy current probe 70 includes only a magnetoresistive sensor 76 and an excitation wire 78 that can be coupled to a high-frequency AC source 30. Probe 70 can be fabricated in any of the ways described above and illustrated herein as it relates to the surface inspection portion of the surface and sub-surface probes/systems. It is therefore to be understood that, within the scope of the appended claims, the invention may be practiced other than as specifically described.

What is claimed as new and desired to be secured by Letters Patent of the United States is:

1. An eddy current probe comprising:
   an excitation coil having windings adapted to be coupled to a low-frequency alternating current (AC) source;
   at least one magnetoresistive sensor centrally disposed within said excitation coil and at one end of said excitation coil to thereby define a sensing end of said eddy current probe adapted to be positioned adjacent to a surface of a structure, each said magnetoresistive sensor having an axis of sensitivity;
   a tubular flux focusing lens disposed between said excitation coil and each said magnetoresistive sensor for preventing magnetic coupling between said excitation coil and each said magnetoresistive sensor, said lens being made from an electrically-conductive material having a high magnetic permeability; and
   an excitation wire spaced apart from each said magnetoresistive sensor wherein said excitation wire is perpendicular to each said axis of sensitivity and such that, when said sensing end of said eddy current probe is positioned adjacent to the surface of the structure, said excitation wire is disposed between each said magnetoresistive sensor and the surface of the structure, said excitation wire adapted to be coupled to a high-frequency AC source.

2. The eddy current probe as in claim 1, wherein said excitation wire extends in one dimension.

3. The eddy current probe as in claim 1, wherein said excitation wire extends in at least two orthogonal dimensions.

4. The eddy current probe as in claim 1, wherein each said magnetoresistive sensor is encased in a dielectric housing with a channel formed therein, and wherein said excitation wire resides in said channel.

5. The eddy current probe as in claim 4, wherein said channel extends in one dimension.

6. The eddy current probe as in claim 4, wherein said channel extends in at least two orthogonal dimensions.

7. The eddy current probe as in claim 1, wherein each said magnetoresistive sensor is selected from the group consisting of a anisotropic magnetoresistive sensor and a giant magnetoresistive sensor.

8. The eddy current probe as in claim 1, wherein said excitation wire comprises a single-strand wire.

9. An eddy current probe system comprising:
   an excitation coil having windings;
   a first alternating current (AC) source coupled to said excitation coil for supplying a first AC drive signal thereto wherein said first AC drive signal has a frequency less than approximately 100 KHz;
   a magnetoresistive sensor centrally disposed within said excitation coil and at one end of said excitation coil to thereby define a sensing end of said eddy current probe adapted to be positioned adjacent to a surface of a structure, said magnetoresistive sensor having an axis of sensitivity;
   a tubular flux focusing lens disposed between said excitation coil and said magnetoresistive sensor for preventing magnetic coupling between said excitation coil and said magnetoresistive sensor, said lens being made from an electrically-conductive material having a magnetic permeability of at least approximately 100 $\mu_0$H/m;
   an excitation wire spaced apart from said magnetoresistive sensor wherein said excitation wire is perpendicular to said axis of sensitivity and such that, when said sensing end of said eddy current probe is positioned adjacent to the surface of the structure, said excitation wire is disposed between said magnetoresistive sensor and the surface of the structure; and
   a second AC source coupled to said excitation wire for supplying a second AC drive signal thereto wherein said second AC drive signal has a frequency greater than said first AC drive signal and greater than approximately 100 KHz.

10. The eddy current probe system as in claim 9, wherein said excitation wire extends in one dimension.

11. The eddy current probe system as in claim 9, wherein said excitation wire extends in at least two orthogonal dimensions.

12. The eddy current probe system as in claim 9, wherein said magnetoresistive sensor is encased in a dielectric housing with a channel formed therein, and wherein said excitation wire resides in said channel.

13. The eddy current probe system as in claim 12, wherein said channel extends in one dimension.

14. The eddy current probe system as in claim 12, wherein said channel extends in at least two orthogonal dimensions.

15. The eddy current probe system as in claim 9, wherein said magnetoresistive sensor is selected from the group consisting of a anisotropic magnetoresistive sensor and a giant magnetoresistive sensor.

16. The eddy current probe system as in claim 9, wherein said excitation wire comprises a single-strand wire.

17. An eddy current probe, comprising:
   an excitation coil having windings adapted to be coupled to a low-frequency alternating current (AC) source;
   at least one magnetoresistive sensor encased in a dielectric housing centrally disposed within said excitation coil and at one end of said excitation coil to thereby define a sensing end of said eddy current probe adapted to be positioned adjacent to a surface of a structure, each said magnetoresistive sensor having an axis of sensitivity, said dielectric housing having a channel formed therein at said sensing end of said eddy current probe with a base of said channel lying in a plane that is spaced apart from each said magnetoresistive sensor and perpendicular to each said axis of sensitivity;
   a tubular flux focusing lens disposed between said excitation coil and each said magnetoresistive sensor for preventing magnetic coupling between said excitation coil and each said magnetoresistive sensor, said lens being made from an electrically-conductive material having a high magnetic permeability; and
   an excitation wire residing in said channel at said base thereof such that, when said sensing end of said eddy current probe is positioned adjacent to the surface of the structure, said excitation wire is disposed between each said magnetoresistive sensor and the surface of the structure, said excitation wire adapted to be coupled to a high-frequency AC source.

18. The eddy current probe as in claim 17, wherein said excitation wire extends in one dimension in said plane.

19. The eddy current probe as in claim 17, wherein said excitation wire extends in at least two orthogonal dimensions in said plane.

20. The eddy current probe as in claim 17, wherein each said magnetoresistive sensor is selected from the group consisting of a anisotropic magnetoresistive sensor and a giant magnetoresistive sensor.

* * * * *